US006919275B2

(12) United States Patent
Chiang et al.

(10) Patent No.: US 6,919,275 B2
(45) Date of Patent: **\*Jul. 19, 2005**

(54) METHOD OF PREVENTING DIFFUSION OF COPPER THROUGH A TANTALUM-COMPRISING BARRIER LAYER

(75) Inventors: Tony Chiang, Mountain View, CA (US); Gongda Yao, Fremont, CA (US); Peijun Ding, San Jose, CA (US); Fusen E. Chen, Cupertino, CA (US); Barry L. Chin, Saratoga, CA (US); Gene Y. Kohara, Fremont, CA (US); Zheng Xu, Foster City, CA (US); Hong Zhang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 10/796,602

(22) Filed: Mar. 8, 2004

(65) Prior Publication Data

US 2004/0171250 A1 Sep. 2, 2004

Related U.S. Application Data

(63) Continuation of application No. 09/886,439, filed on Jun. 20, 2001, now Pat. No. 6,758,947, which is a continuation of application No. 08/978,792, filed on Nov. 26, 1997, now abandoned.

(51) Int. Cl.[7] .......................... H01L 21/44; H01L 21/31

(52) U.S. Cl. ..................... 438/687; 438/653; 438/785

(58) Field of Search .................. 438/687, 653, 438/785

(56) References Cited

U.S. PATENT DOCUMENTS

| 4,407,712 A | 10/1983 | Henshaw et al. | ........... 204/298 |
| 4,514,437 A | 4/1985 | Nath | ........................... 427/39 |

(Continued)

FOREIGN PATENT DOCUMENTS

| EP | 0451571 | 10/1991 | ....... H01L/21/3205 |
| EP | 0823279 | 11/1998 | ........... B01D/53/46 |
| JP | 8097279 | 12/1996 | ......... H01L/21/768 |

OTHER PUBLICATIONS

Rossnagel et al., "Metal ion deposition from ionized mangetron sputtering discharge", *J. Vac. Sci. Technol.* B, vol. 12, No. 1, pp. 449–453 (Jan./Feb. 1994).

(Continued)

*Primary Examiner*—Alexander Ghyka
(74) *Attorney, Agent, or Firm*—Shirley L. Church

(57) ABSTRACT

We disclose a method of applying a sculptured layer of material on a semiconductor feature surface using ion deposition sputtering, wherein a surface onto which the sculptured layer is applied is protected to resist erosion and contamination by impacting ions of a depositing layer. A first protective layer of material is deposited on a substrate surface using traditional sputtering or ion deposition sputtering, in combination with sufficiently low substrate bias that a surface onto which the layer is applied is not eroded away or contaminated during deposition of the protective layer. Subsequently, a sculptured second layer of material is applied using ion deposition sputtering at an increased substrate bias, to sculpture a shape from a portion of the first protective layer of material and the second layer of depositing material. The method is particularly applicable to the sculpturing of barrier layers, wetting layers, and conductive layers upon semiconductor feature surfaces.

4 Claims, 3 Drawing Sheets

U.S. PATENT DOCUMENTS

| | | | |
|---|---|---|---|
| 4,657,778 A | 4/1987 | Moran | 427/53.1 |
| 4,792,842 A | 12/1988 | Honma et al. | 357/71 |
| 4,944,961 A | 7/1990 | Lu et al. | 427/38 |
| 4,976,839 A | 12/1990 | Inoue | 204/192.17 |
| 5,186,718 A | 2/1993 | Tepman et al. | 29/25.01 |
| 5,236,868 A | 8/1993 | Nulman | 437/190 |
| 5,246,885 A | 9/1993 | Braren et al. | 437/225 |
| 5,281,854 A | 1/1994 | Wong | 257/740 |
| 5,302,266 A | 4/1994 | Grabarz et al. | 204/192.12 |
| 5,312,509 A | 5/1994 | Eschbach | 156/345 |
| 5,320,728 A | 6/1994 | Tepman | 204/192.12 |
| 5,354,712 A | 10/1994 | Ho et al. | 437/195 |
| 5,358,616 A | 10/1994 | Ward | 204/192.15 |
| 5,478,455 A | 12/1995 | Actor et al. | 204/192.13 |
| 5,520,784 A | 5/1996 | Ward | 204/192.15 |
| 5,585,673 A | 12/1996 | Joshi et al. | 257/751 |
| 5,589,713 A | 12/1996 | Lee et al. | 257/773 |
| 5,658,438 A | 8/1997 | Givens et al. | 204/192.11 |
| 5,723,367 A | 3/1998 | Wada et al. | 437/248 |
| 5,725,739 A | 3/1998 | Hu | 204/192.3 |
| 5,780,357 A | 7/1998 | Xu et al. | 438/639 |
| 5,783,282 A | 7/1998 | Leiphart | 428/138 |
| 5,897,752 A | 4/1999 | Hong et al. | 204/192.12 |
| 5,962,923 A | 10/1999 | Xu et al. | 257/774 |
| 6,143,641 A * | 11/2000 | Kitch | 438/618 |
| 6,287,435 B1 * | 9/2001 | Drewery et al. | 204/298.09 |
| 6,501,180 B1 * | 12/2002 | Kitch | 257/762 |
| 6,573,173 B2 * | 6/2003 | Farkas et al. | 438/633 |
| 6,605,197 B1 | 8/2003 | Ding et al. | 204/192.15 |
| 6,758,947 B2 * | 7/2004 | Chiang et al. | 204/192.12 |
| 2002/0086528 A1 * | 7/2002 | Charneski et al. | 438/680 |
| 2002/0090820 A1 * | 7/2002 | Sun et al. | 438/690 |

OTHER PUBLICATIONS

Rossnagel et al., "Thin, high atomic weight refractory film deposition for diffusion barrier, adhesion layer, and seed layer applications", *J. Vac. Sci. Technol.* B, vol. 14, No. 3, pp. 1819–1827 (May/Jun. 1996).

* cited by examiner

METHOD OF PREVENTING DIFFUSION OF COPPER THROUGH A TANTALUM-COMPRISING BARRIER LAYER

This application is a continuation application of U.S. application Ser. No. 09/886,439, filed Jun. 20, 2001, now U.S. Pat. No. 6,758,947, which is a continuation of application Ser. No. 08/978,792, filed Nov. 26, 1997, which is abandoned.

BACKGROUND OF THE INVENTION

1. Field of the Invention

The present invention pertains to a method of sputtering a sculptured coating over the walls of a high aspect ratio semiconductor feature in a manner which avoids or significantly reduces the possibility of damage to or contamination of underlying surfaces.

2. Brief Description of the Background Art

As the feature size of semiconductor patterned metal features has become increasingly smaller, it is particularly difficult to use the techniques known in the art to provide multilevel metallurgy processing. In addition, future technological requirements include a switch from the currently preferred metallurgy of aluminum to copper in some applications, because of copper's lower resistivity and higher electromigration resistance. The standard reactive ion etching method frequently used for patterning a blanket metal is particularly difficult with copper, since there are no volatile decomposition products of copper at low temperatures (less than about 200° C.). The alternative deposition lift-off techniques are also limited in applicability in a copper structure, given the susceptibility of copper to corrosion by the lift-off solvents. Therefore, the leading process for formation of copper-comprising devices is a damascene structure, which requires the filling of embedded trenches and/or vias.

A typical process for producing a damascene multilevel structure having feature sizes in the range of 0.5 micron ($\mu$) or less would include: blanket deposition of a dielectric material; patterning of the dielectric material to form openings; application of a barrier layer over the surface of the dielectric material; deposition of a conductive material onto the substrate in sufficient thickness to fill the openings; and removal of excessive conductive material from the substrate surface using a chemical, mechanical, or combined technique such as chemical-mechanical polishing. When the feature size is below about 0.25 $\mu$, typically the barrier layer and/or the conductive fill layer are deposited using a method selected from chemical vapor deposition (CVD), evaporation, electroplating, or ion deposition sputtering. Chemical vapor deposition, being completely conformal in nature, tends to create voids in the center of the filled opening, particularly in the instance of high aspect ratio features. Further, contaminants from the deposition source are frequently found in the deposited conductive material, which may affect adhesion and other film properties. Evaporation is successful in covering shallow features, but is generally not practical for the filling of high aspect ratio features, in part because the deposition rate for the evaporation technique is particularly slow, and also because of poor step coverage. Electroplating has recently shown promise as a method of filling contact vias, but the crystal orientation of electroplated copper is not optimum for the reduction of electromigration unless a proper seed layer is deposited prior to electroplating. Sputtered copper has been used to provide a seed layer over which a fill layer of electroplated copper or CVD copper can be applied, to improve crystal structure and improve device performance.

No matter which technique is used for the application of copper, prior to that application it is necessary to apply a barrier layer which prevents the diffusion of copper into adjacent materials. The barrier layer needs to be continuous and free from any openings which might permit the diffusion of copper atoms. Formation of such a continuous barrier layer is particularly difficult when the barrier layer must cover the surface of a feature having an aspect ratio of greater than about 3:1 and a feature size of 0.5 $\mu$m or less. The preferred method of application of a barrier layer is physical vapor deposition (PVD) with plasma sputtering being preferred among the PVD methods, due to the higher deposition rates obtainable using this method. Traditional plasma sputtering is used when possible, due to simplicity of the equipment required to carry out deposition. In some instances, when particularly small feature sizes are involved, less than 0.25 $\mu$, for example, it may be necessary to use ion-deposition plasma (IMP) sputtering techniques.

Due to the difficulty in sculpturing a coating layer, whether it be a barrier layer, or a principally conductive layer, to fit a high aspect ratio, small dimensioned feature, a number of techniques have been developed in an attempt to provide the properly-shaped coating layer.

U.S. Pat. No. 5,312,509 of Rudolph Eschbach, issued May 17, 1974, discloses a manufacturing system for low temperature chemical vapor deposition (CVD) of high purity metals. In particular, a semiconductor substrate including etched patterns is plasma cleaned, sputter coated with adhesion and nucleation seed layers, and a conductive layer is then applied using CVD. The CVD deposited metal is formed using a complex combination of reactor and substrate conditions which are controlled using a computer guidance system. This manufacturing system is recommended for the CVD deposition of pure copper at low temperatures.

U.S. Pat. No. 4,514,437 to Prem Nath, issued Apr. 30, 1985, discloses a method and apparatus for depositing thin films, such as indium tin oxide, onto substrates. The deposition comprises one step in the fabrication of electronic, semiconductor and photovoltaic devices. An electron beam is used to vaporize a source of solid material, and electromagnetic energy is used to provide an ionizable plasma from reactant gases. By passing the vaporized solid material through the plasma, it is activated prior to deposition onto a substrate. In this manner, the solid material and the reactant gases are excited to facilitate their interaction prior to the deposition of the newly formed compound onto the substrate.

U.S. Pat. No. 4,944,961 to Lu et al., issued Jul. 31, 1990, describes a process for partially ionized beam deposition of metals or metal alloys on substrates, such as semiconductor wafers. Metal vaporized from a crucible is partially ionized at the crucible exit, and the ionized vapor is drawn to the substrate by an imposed bias. Control of substrate temperature is said to allow non-conformal coverage of stepped surfaces such as trenches or vias. When higher temperatures are used, stepped surfaces are planarized. The examples given are for aluminum deposition, where the non-conformal deposition is carried out with substrate temperatures ranging between about 150° C. and about 200° C., and the planarized deposition is carried out with substrate temperatures ranging between about 250° C. and about 350° C.

U.S. Pat. No. 4,976,839 to Minoru Inoue, issued Dec. 11, 1990 discloses a titanium nitride barrier layer of 500 Å to 2,000 Å in thickness formed by reactive sputtering in a mixed gas including oxygen in a proportion of 1% to 5% by volume relative to the other gases, comprising an inert gas and nitrogen. The temperature of the silicon substrate during deposition of the titanium nitride barrier layer ranged between about 350° C. and about 500° C. during the sputtering, and the resistivity of the titanium nitride film was "less than 100 $\mu\Omega$-cm".

U.S. Pat. No. 5,246,885 to Braren et al., issued Sep. 21, 1993, proposes the use of a laser ablation system for the filling of high aspect ratio features. Alloys, graded layers, and pure metals are deposited by ablating targets comprising more than one material using a beam of energy to strike the target at a particular angle. The ablated material is said to create a plasma composed primarily of ions of the ablated material, where the plasma is translated with high directionality toward a surface on which the material is to be deposited. The preferred source of the beam of energy is a UV laser. The heating of the deposition surface is limited to the total energy deposited by the beam, which is said to be minimal.

S. M. Rossnagel and J. Hopwood describe a technique of combining conventional magnetron sputtering with a high density, inductively coupled RF plasma in the region between the sputtering cathode and the substrate in their 1993 article titled "Metal ion deposition from ionized magnetron sputtering discharge", published in the J. Vac. Sci. Technol. B. Vol. 12, No. 1, January/February 1994. One of the examples given is for titanium nitride film deposition using reactive sputtering, where a titanium cathode is used in combination with a plasma formed from a combination of argon and nitrogen gases. The resistivity of the films produced ranged from about 200 $\mu\Omega$-cm to about 75 $\mu\Omega$-cm, where higher ion energies were required to produce the lower resistivity films. The higher the ion energy, the more highly stressed the films, however. Peeling of the film was common at thicknesses over 700 Å, with depositions on circuit topography features delaminating upon cleaving.

S. M. Rossnagel and J. Hopwood describe a technique which enables control of the degree of directionality in the deposition of diffusion barriers in their paper titled "Thin, high atomic weight refractory film deposition for diffusion barrier, adhesion layer, and seed layer applications" J. Vac. Sci. Technol. B 14(3), May/June 1996. In particular, the paper describes a method of depositing tantalum (Ta) which permits the deposition of the tantalum atoms on steep sidewalls of interconnect vias and trenches. The method uses conventional, non-collimated magnetron sputtering at low pressures, with improved directionality of the depositing atoms. The improved directionality is achieved by increasing the distance between the cathode and the workpiece surface (the throw) and by reducing the argon pressure during sputtering. For a film deposited with commercial cathodes (Applied Materials Endura® class; circular planar cathode with a diameter of 30 cm) and rotating magnet defined erosion paths, a throw distance of 25 cm is said to be approximately equal to an interposed collimator of aspect ratio near 1.0. In the present disclosure, use of this "long throw" technique with traditional, non-collimated magnetron sputtering at low pressures is referred to as "Gamma sputtering". Gamma sputtering enables the deposition of thin, conformal coatings on sidewalls of a trench having an aspect ratio of 2.8:1 for 0.5 $\mu$m-wide trench features. However, Gamma sputtered TaN films exhibit a relatively high film residual compressive stress which can cause a Ta film or a tantalum nitride (e.g. $Ta_2N$ or TaN) film to peel off from the underlying substrate (typically silicon oxide dielectric). In the alternative, if the film does not peel off, the film stress can cause feature distortion on the substrate (typically a silicon wafer) surface or even deformation of a thin wafer.

U.S. Pat. No. 5,354,712 to Ho et al., issued Oct. 11, 1994, describes a method for forming interconnect structures for integrated circuits. Preferably, a barrier layer of a conductive material such as sputtered titanium nitride (TiN) is deposited over a trench surface which is defined by a dielectric layer. The TiN provides a seed layer for subsequent metal deposition. A conformal layer of copper is selectively deposited over the conductive barrier layer using CVD techniques.

U.S. Pat. No. 5,585,763, issued to Joshi et al. on Dec. 17, 1996, discloses refractory metal capped low resistivity metal conductor lines and vias. In particular, the low resistivity metal is deposited using physical vapor deposition (e.g., evaporation or collimated sputtering), followed by chemical vapor deposition (CVD) of a refractory metal cap. Recommended interconnect metals include $Al_xCu_y$ (wherein the sum of x and y is equal to one and both x and y are greater than or equal to zero).

The equipment required for collimated sputtering is generally difficult to maintain and difficult to control, since there is a constant build up of sputtered material on the collimator over time. Collimated sputtering is described in U.S. Pat. No. 5,478,455 to Actor et al., issued Dec. 26, 1995. Collimation, whether for sputtering or evaporation, is inherently a slow deposition process, due to the reduction in sputtered flux reaching the substrate.

U.S. Pat. No. 6,605,197, of the present applicants, filed issued Aug. 12, 2003, describes a method of filling features on a semiconductor workpiece surface with copper using sputtering techniques. The surface temperature of the substrate is controlled within particular temperature ranges during application of the copper layer. The sputtering method is selected from a number of potential sputtering methods, including gamma sputtering, coherent sputtering, IMP (ion metal plasma), and traditional sputtering, all of which are described in detail. The content of U.S. Pat. No. 6,605,197, is hereby incorporated by reference in its entirety.

U.S. Pat. No. 5,962,923 of Xu et al. issued Oct. 5, 1999, assigned to the Assignee of the present invention, and hereby incorporated by reference in its entirety, describes a method of forming a titanium nitride-comprising barrier layer which acts as a carrier layer. The carrier layer enables the filling of apertures such as vias, holes or trenches of high aspect ratio and the planarization of a conductive film deposited over the carrier layer at reduced temperatures compared to prior art methods. The Xu et al. preferred embodiment carrier layer is a Ti/TiN/Ti three layered structure which is deposited using ion deposition (or ion metal plasma) sputtering techniques. FIG. 1 of the present application shows a schematic of a cross-sectional view of a contact via which includes the carrier layer of Xu et al. In particular, FIG. 1 shows an exemplary contact 118 formed in a high aspect ratio aperture 113. Specifically, aperture 113 has an aspect ratio of about 5:1, where dimension 120 is about 0.25$\mu$ wide and dimension 122 is about 1.2$\mu$. The contact 118 includes at least two sub-elements. A carrier layer 100, which also acts as a barrier layer, and a conductive material 119 which has been deposited over the carrier layer 100, to fill the volume of the aperture remaining after the carrier layer has been deposited.

With reference to carrier/barrier layer 100, this three-layered structure is formed from a first sub-layer 112 of titanium which was sputtered from a target and partially ionized (10% to 100% ionization) prior to being deposited on the surface of both silicon dioxide layer 111 and silicon base 110. The technique wherein the target material is ionized after leaving the target and prior to deposition on the substrate is referred to as "ion deposition sputtering" or as "ion metal plasma" (IMP) sputtering. The second sub-layer 114 is a layer of sputtered titanium which is partially ionized and reacted with nitrogen to form titanium nitride before deposition over first sub-layer 112. The third sub-layer 116 is a layer composed of both sputtered titanium and titanium nitride deposited in a partially ionized state.

To provide the three layer structure of carrier layer 100 as shown in FIG. 1, all three layers 100 are preferably deposited in a single chamber in a continuous process. This may be accomplished, in the case of a titanium based carrier layer, by following the steps of sputtering a titanium target, ionizing at least a portion of the titanium (10 % to 100 %) before it is deposited on the substrate, attracting the ionized target material to the substrate and forming the first sublayer therewith; then introducing a sufficient quantity of a reactive gas, preferably nitrogen, into the chamber as sputtering and ionization continues and thereby causing all of the material sputtered from the target to react with the gas to form a compound film layer of TiN on the substrate; and then stopping the flow of reactive gas to the chamber while still sputtering the target and ionizing the sputtered target material to form a film layer on the substrate composed of both the base target material, preferably Ti and a reacted product, preferably TiN. Once the Ti/TiN sub-layer has been formed to a sufficient thickness, the power to the system is shut off to stop the sputtering process.

The carrier/barrier layer, once deposited, provides a conformal layer having a thickness of approximately 800 Å, leaving an interior volume 117 within the aperture to be filled with conductive material 119. The conformal carrier/barrier layer 100 was deposited using partially ionized sputtered titanium and titanium nitride, which partially ionized material was directed toward aperture substrates 110 and 111 using an electric field on the substrate support platen (not shown). The equipment used to provide the partially ionized sputtered materials and the electric field on the substrate is described in detail in the Xu et al. patent application, and is described in more general terms below.

The conformal carrier/barrier layer 100 as depicted in the Xu et al. FIG. 1 is achieved only if an adequate electric field (bias) is applied to the support platen (not shown) upon which the substrate sets, thereby imparting a bias to the substrate itself. Typically the substrate bias was about −70V.

We have discovered that application of a substrate bias of about −70 V during the application of layer 112, causes ions to impact on underlying silicon substrate 110 and silicon dioxide sidewall substrate 111, and results in a simultaneous sputtering of these surfaces. Atoms sputtered from silicon substrate 110 and silicon dioxide substrate 111 contaminate surrounding surfaces of other materials as well as the composition of barrier layer 112. The present invention provides a method of depositing and sculpting a sputtered carrier/barrier layer 100 to the desired shape without significantly contaminating or disturbing surrounding surfaces.

SUMMARY OF THE INVENTION

In accordance with the present invention, we disclose a method of applying a sculptured layer of material on a semiconductor feature surface using ion deposition sputtering, wherein a surface onto which the sculptured layer is applied is protected to resist erosion and contamination by impacting ions of a depositing layer, said method comprising the steps of:

a) applying a first portion of a sculptured layer using traditional sputtering or ion deposition sputtering,.with sufficiently low substrate bias that a surface onto which said sculptured layer is applied is not eroded away or contaminated in an amount which is harmful to said semiconductor feature performance or longevity; and b) applying a subsequent portion of said sculptured layer using ion deposition sputtering, with sufficiently high substrate bias to sculpture a shape from said first portion, while depositing additional layer material.

The method is particularly applicable to the sculpturing of barrier layers, wetting layers and conductive layers upon semiconductor feature surfaces. When the conductive layer is tungsten and the barrier layer is titanium, using the method to deposit the titanium layer, so that the titanium is not contaminated by impurities sputtered off of surfaces adjacent the bottom of a contact via, for example, prevents an increase in the resistivity of the contact. When the conductive layer is aluminum and the underlying layer is a titanium wetting layer, use of the method to deposit the titanium avoids contamination of the titanium wetting layer by oxygen sputtered off of adjacent silicon dioxide surfaces during the titanium. An aluminum layer subsequently applied over the non-contaminated titanium layer will flow better over the titanium layer. When the conductive layer is copper and the underlying layer is a tantalum barrier layer, for example, the method enables deposition of a non-contaminated and conformal tantalum barrier layer, even at small feature size and high aspect ratio.

A conformal tantalum barrier layer of relatively uniform thickness is critical when the overlying layer is copper, since the surface diffusion characteristics of copper cause diffusion into adjacent materials unless a proper barrier layer is used to isolate the copper. To prevent the copper from diffusing into adjacent materials, the barrier layer used to isolate the copper must be continuous; preferably, the layer is conformal and has a minimum thickness of at least about 5 Å, depending on feature geometry. For example, and not by way of limitation, when the aspect ratio of a feature such as a trench or a contact via is high (typically greater than about 3:1) and the feature size is small (typically the largest dimension at the bottom of the trench or via is about 0.5 $\mu$ or less), the barrier layer thickness on the walls near the base of the trench or via tends to thin. The higher the aspect ratio, the greater the thinning effect. Since the layer deposition is non-conformal, if additional material is deposited to compensate for the thinning, a large overhang (shoulder) is produced inside the feature near the opening of the feature. This overhang interferes with filling of the feature with a conductive material and may cause an increase in via/contact or line resistance. It is necessary to use ion deposition plasma techniques to deposit a more conformal layer. In addition, to provide a sculptured thickness of a barrier layer over the surface of a feature, it is necessary to bias the feature surface during deposition of the barrier layer.

To avoid contamination of surrounding surfaces and the barrier layer or wetting layer material itself during deposition, the barrier layer or wetting layer is deposited as follows: a first portion of material is deposited on the substrate surface using either a traditional sputtering technique or using an ion deposition plasma, but in combination with sufficiently low substrate bias voltage that the surfaces toward which ionized barrier layer material is attracted are not sputtered in an amount which is harmful to device performance or longevity. Typically, the substrate bias voltage should be less than about −20 V. Excellent results are achieved when no power is applied to the substrate support platen to bias the substrate. Preferably, the initial deposition is carried out at vacuum chamber pressures greater than about 10 mT. The barrier layer or wetting layer can be deposited at temperatures commonly used in the art.

After deposition of a first portion of barrier layer material, the bias voltage is increased during the deposition of additional barrier layer material over the feature surface. The application of increased bias voltage results in the resputtering (sculpturing) of the first portion of barrier layer or wetting layer material (deposited at the lower substrate bias voltage) while enabling a more anisotropic deposition of newly depositing material. Availability of the material which was deposited at the lower bias voltage on the surface of a trench or via protects the substrate surface under the barrier or wetting layer material during the sputtering deposition at higher bias voltage. This avoids breakthrough into the substrate by impacting ionized material which could destroy device functionality. It also reduces or avoids contamination of the barrier or wetting layer with material sputtered from adjacent surfaces during application of the barrier or wetting layer.

The barrier layer may be sculptured using a combination of multiple non-substrate-biased and substrate-biased deposition steps or a gradual ramp up of bias power under varying conditions optimized for the feature geometries of interest.

A conductive material seed layer, and particularly a copper seed layer applied to the feature may be accomplished using the same sculpturing technique as that described above with reference to the barrier layer and wetting layer. Sculpturing of a copper seed layer is especially important when the copper fill is to be achieved by electroplating chemical vapor deposition (CVD), PVD (for example , the copper deposition technique described in applicants' U.S. Pat. No. 6,605,197, issued Aug. 12, 2003 combination of these methods. It is necessary to have a continuous conformal seed layer. Without sculpturing of the copper seed layer, there is typically too much overhang of deposited material at the top of a contact via. This overhang leads to closure of the via opening prior to complete fill of the via, leaving voids inside the contact. If there is too much sputtering of the copper seed layer, this creates an absence of seed layer at the bottom of the via. Absence of copper seed layer causes voids to form at the bottom of the via due to lack of copper growth in that area. (When the copper fill is deposited using electroplating, there is a lack of current for electroplating in areas where there is no copper seed layer.) The present method provides a continuous conformal seed layer. Substrate temperature is critical during the deposition and sculpturing of a copper seed layer, to avoid dewetting of the copper from the barrier layer surface. Preferably the substrate temperature during deposition and sculpturing of a copper seed layer is less than about 500° C., and more preferably less than about 200° C.

BRIEF DESCRIPTION OF THE DRAWINGS

FIG. 1 is a prior art drawing taken from U.S. Pat. No. 5,962,923, issued Oct. 5. 1999, to Xu et al. which patent is assigned to the assignee of the present invention.

FIG. 2 is a prior art drawing taken from U.S. Pat. No. 5,962,923 of Xu et al. ,issued Oct. 5, 1999.

DETAILED DESCRIPTION OF THE PREFERRED EMBODIMENTS

Figure 1:
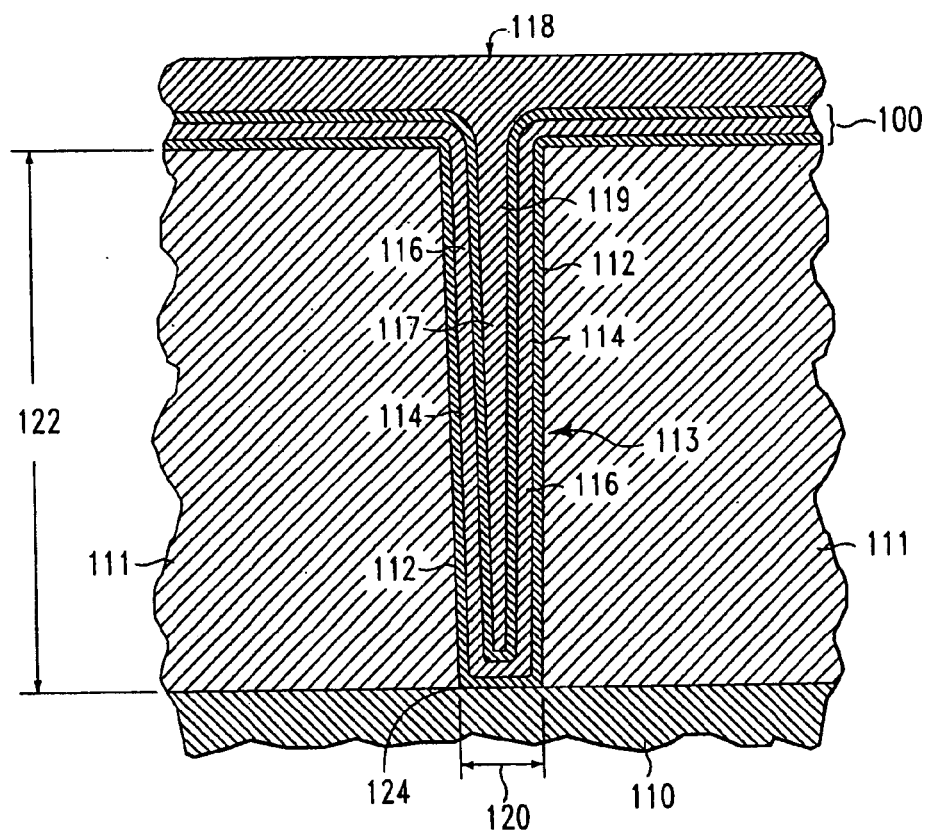
FIG. 1 shows a schematic of a cross-sectional view of a contact via including a multiple-layered barrier layer overlaid with a metallic conductive layer.

Application of thin barrier layers, wetting layers, and seed layers of conductive materials to the surface of a semiconductor feature requires tailoring of the layer to the shape of the feature if optimum feature performance is to be achieved.

Tailoring of such thin layers using physical vapor deposition (PVD) techniques has been of particular interest in recent years due to the many desirable properties of materials applied using PVD. Ion deposition sputtering, also known as IMP, has been used to enable PVD application of material layers in features having small feature size and high aspect ratios. However, ion deposition sputtering can have adverse side effects in terms of erosion via sputtering of underlying layers which are contacted by the ion deposition sputtered material. Further, the material eroded away from the underlying layer can contaminate adjacent surfaces of the feature.

The present method for applying an ion deposition sputtered sculptured layer of material on a semiconductor feature surface avoids sputtering of the substrate on which the ion deposition layer is deposited. The method is particularly useful in the deposition of barrier layers at the bottom of a via, where contamination from adjacent surfaces during deposition of the barrier layer can ultimately increase resistivity of the contact. The method is particularly useful in the deposition of a barrier layer when a conformal relatively uniform deposition is required to prevent diffusion of the material used as the conductive layer into adjacent dielectric materials. The method is particularly useful in the deposition of a wetting layer when contamination of the wetting layer affects the ability of the layer to perform the wetting function. The method is particularly useful in the deposition of a conductive seed layer when contamination of the seed layer prevents the formation of a proper crystal structure in subsequently deposited conductive material. Further, in instances where the feature size is small and the aspect ratio is high and it is necessary to obtain a continual conformal seed layer of conductive material over the feature surface, the ability to sculpture the conformal layer is especially advantageous, as is the case when the conductive material is copper.

To prevent copper from diffusing into adjacent materials, the barrier layer used to isolate the copper needs to be continuous and is preferably conformal and substantially uniform in thickness, having a minimum thickness of at least about 5 Å, depending on feature geometry. When the feature size is small and the aspect ratio is high, a barrier layer applied over a feature such as a trench or contact via surface tends to thin out toward the bottom of the feature. In order to obtain the desired barrier layer minimum thickness on the feature walls near the bottom, it is necessary to use ion deposition plasma techniques to deposit the barrier layer. In addition, it is necessary to bias the surface the barrier layer is applied to, to form the barrier layer material in a manner which provides a sculptured, substantially uniform, conformal coating shape. It is important to avoid contamination of surrounding surfaces and the barrier layer material itself during deposition of the barrier layer. The same is true with regard to copper contamination of underlying layers and contamination of the copper layer itself during deposition of a copper layer over the barrier layer. Sputtering of the underlying substrate material can cause damage, destroy barrier layer properties, or poison a copper seed layer (e.g. low resistivity materials such as copper are extremely sensitive to impurities). To avoid the sputtering of underlying substrate material, it is necessary to first sputter deposit a protective layer of material over the surface of the feature using sufficiently low substrate bias voltage that the surfaces toward which depositing ionized material is attracted are not sputtered in an amount which is harmful to device performance or longevity. After deposition of at least a portion of the barrier layer material, the bias voltage is increased to assist in the sculpturing of both the previously deposited and the newly depositing barrier material. This same technique can be used during the deposit of a copper seed layer, to avoid copper contamination of underlying material layers.

The method of the present invention is not intended to be limited to applications in which copper is the conductive layer, however. The avoidance of the erosion of underlying layers during the deposition of barrier layers and metal conductive seed layers and fill layers is applicable to other systems such as an aluminum conductive layer used in combination with a Ti/TiN barrier layer, for example.

I. DEFINITIONS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF or DC glow discharge, and references to "copper", "aluminum" and "tungsten" includes alloys thereof. In particular, herein, the reference to compounds such as "TiN", "TaN", "MoN", "WN", "TiSiN", "TaSiN", "MoSiN", "WSiN", and the like is intended to include all compounds containing a combination of the elements listed and is not intended to be limited a particular stoichiometry.

Specific terminology of particular importance to the description of the present invention is defined below.

The term "aluminum" includes alloys of aluminum of the kind typically used in the semiconductor industry. Such alloys include aluminum-copper alloys, and aluminum-copper-silicon alloys, for example. Typically such alloys of aluminum comprise about 0.5% copper.

The term "anisotropic deposition" refers to the deposition of material which does not proceed in all directions at the same rate. If deposition occurs exclusively in one direction, the deposition process is said to be completely anisotropic in that direction.

The term "aspect ratio" refers to the ratio of the height dimension to the width dimension of particular openings into which an electrical contact is to be placed. For example, a via opening which typically extends in a cylindrical form through multiple layers has a height and a diameter, and the aspect ratio would be the height of the cylinder divided by the diameter. The aspect ratio of a trench would be the height of the trench divided by the minimal width of the trench at its base.

The term "copper" refers to copper and alloys thereof, wherein the copper content of the alloy is at least 80 atomic %. The alloy may comprise more than two elemental components.

The term "feature" refers to contacts, vias, trenches, and other structures which make up the topography of the substrate surface.

The term "ion-deposition plasma sputtered" and the term "ion metal plasma (IMP) refer to sputter deposition, preferably magnetron sputter deposition, where a high density, inductively coupled RF plasma is created between the sputtering cathode and the substrate support electrode, whereby at least a portion of the sputtered emission is in the form of ions at the time it reaches the substrate surface.

The term "ion-deposition plasma sputtered copper" or "IMP sputtered copper" or "IMP copper" refers to a copper deposition which was sputtered using the IMP sputter deposition process.

The term "reactive ion-deposition plasma sputtering" or "reactive ion metal plasma (IMP)" refers to ion-deposition plasma sputtering wherein a reactive gas is supplied during the sputtering to react with the ionized material being sputtered, producing an ion-deposition sputtered compound containing the reactive gas element.

The term "seed layer" refers to a layer which is deposited to promote adhesion, enhance nucleation, and to obtain a desired crystal orientation during subsequent deposition (typically of the same material). With reference to the preferred embodiment described subsequently herein, where a copper seed layer is deposited using IMP sputtering means and then sculptured using the method described herein, this provides a thin seed layer which ensures proper nucleation during subsequent copper application by electroplating.

The term "SEIM" refers to a scanning electron microscope.

The term "traditional sputtering" or "standard sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

II. AN APPARATUS FOR PRACTICING THE INVENTION

The sculpturing method of the present invention may be carried out in a Centura® or in an Endura® Integrated Processing System available from Applied Materials, Inc. (Santa Clara, Calif.). The Endura® system is shown and described in U.S. Pat. Nos. 5,186,718 and 5,236,868, the disclosures of which are incorporated by reference.

Figure 2:
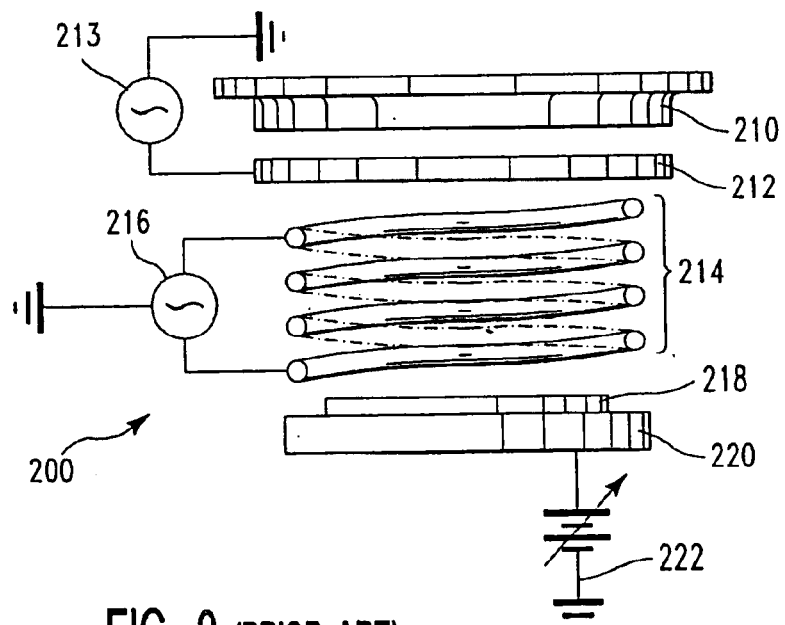
FIG. 2 illustrates, in schematic format, an apparatus of the kind which can be used to obtain ionization of sputtered target atoms prior to their deposition on a substrate and to attract the ionized material to the substrate.

To form the barrier layer structure of the present invention, the processing elements shown in FIG. 2 can be operated within one of the low pressure process chambers contained within an Endura® Integrated Processing System. With reference to FIG. 2, the low pressure process chamber for forming the barrier layer of the present invention employs a standard sputter magnet 210 (to confine the sputtering plasma, enabling an increased sputtering rate) and a tantalum sputtering target cathode 212 of about 14 inches (35.5 cm) in diameter, with a DC power 213 applied to this cathode over a range from about 0.5 kW to about 8 kW. The substrate, 212 was an 8 inch (200 mm) diameter silicon wafer, having a 1.2 µm thick layer of silicon dioxide dielectric overlying the silicon wafer. The dielectric layer had been patterned to contain contact vias which were 0.35 µm in diameter at the bottom and 1.2 µm in height. The substrate wafer was placed a distance of about 5 inches (13 cm) from target cathode 212. A high density, inductively coupled RF plasma was generated in the region between the target cathode 212. A high density, inductively coupled RF plasma was generated in the region between the target cathode 212 and the substrate 218 by applying RF power 216 over a range from about 100 kHz to about 60 MHz preferably from about 2 MHz to about 13.56 MHz) to a single or multiple turn metal coil strip 214 at a wattage ranging from about 0.5 kW to about 6 kW (and preferably ranging from about 1.5 kW to about 4 kW). Preferably the coil strip 214 consists of less than 3 to 4 turns.

III. THE FORM OF THE BARRIER LAYER WITHIN THE TRENCH OR VIA

Example One

Figure 3:
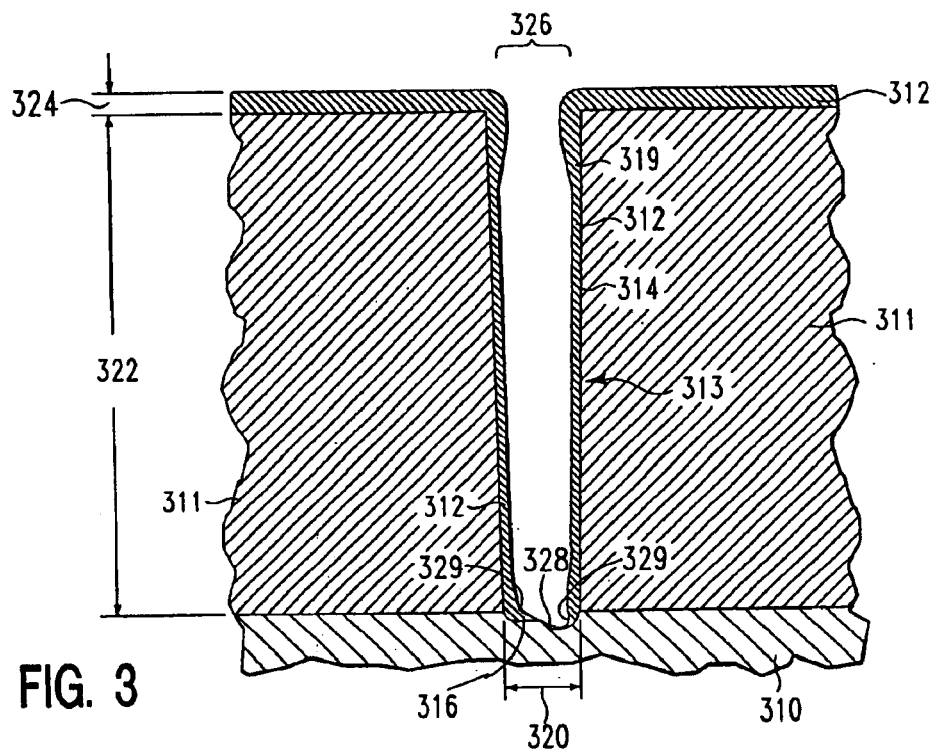
FIG. 3 shows a schematic of a cross-sectional view of a contact via where a substrate bias is used to attract the ionized atoms. The impacting ions can erode away the base of the contact.

FIG. 3 shows a schematic of a SEM profile of silicon wafer substrate 310 with a silicon dioxide dielectric layer 311 deposited thereover. The silicon dioxide layer 311 had been patterned to contain a via 313 having a bottom dimension 320 of 0.35 µm and a height 322 of 1.2 µm. A tantalum barrier layer 312 was applied over the surface 314 of the via 313 using an ion-deposition plasma process. In particular, the DC power to the target was 2 kW, the RF power to the coil (at 2 MHz) was 1.5 kW, the bias to the substrate was about −70 V (at about 200 W) during the entire deposition. The pressure in the vacuum chamber was about 40 mT, and the temperature of the substrate at the time of deposition of the tantalum barrier layer 312 was about 75° C. The tantalum barrier layer 312 which was deposited exhibited a thickness 324 of about 900 Å on the upper surface of via 313, and a thickness on the interior walls of via 313 of about 150 Å, with no excessive build up at the upper opening 326 of via 313. Although the layer thickness control over the upper portion of the via wall was good, the high substrate bias caused a break-through 328 at the bottom 316 of the via 313, so that the tantalum was very thin or not present at the break-through 328 location and/or was forced into the underlying silicon substrate 310. Resputtering of depositing tantalum resulted in a build up 329 near the bottom 316 of the via 313. This resultant structure is not acceptable, as it typically leads to leakage and poor resistivity within the contact structure. One skilled in the art can anticipate that, depending on the feature involved, device function would be very adversely affected if not destroyed.

Example Two

Figure 4:
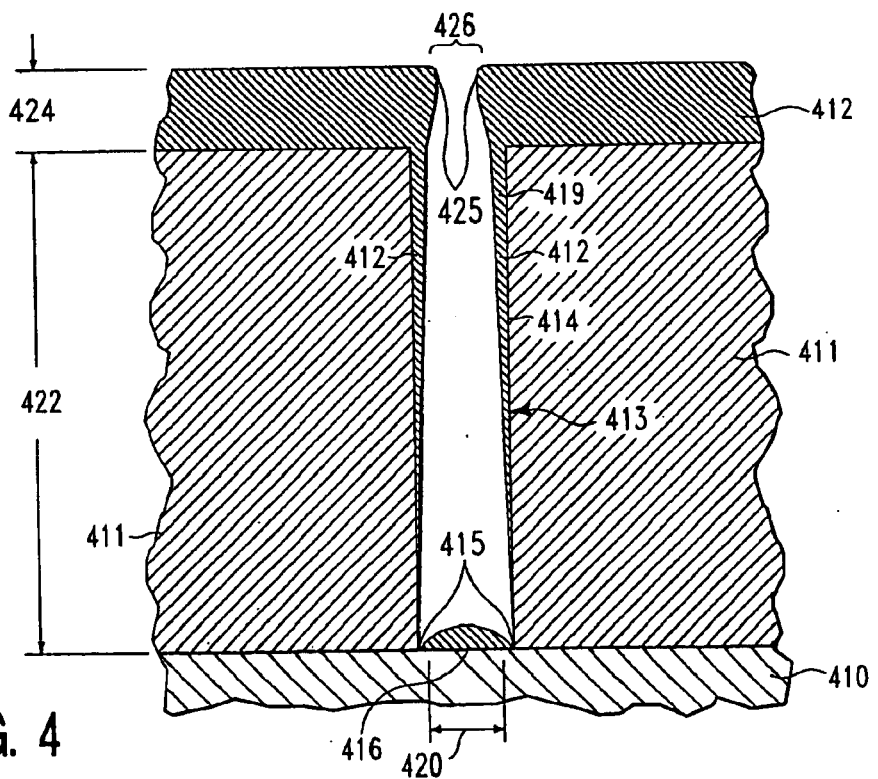
FIG. 4 shows a schematic of the kind shown in FIG. 3, where no substrate bias is used to attract the ionized target atoms. A heavy build up of material occurs near the opening of the via. A relatively thick layer of target material is deposited at the bottom of the via, but the thickness of the deposited layer on the walls of the via near the bottom is very thin.

FIG. 4 shows a schematic of a SEM profile of a silicon wafer substrate 410 with a silicon dioxide dielectric layer 411 deposited thereover. The silicon dioxide layer 411 had been patterned to contain a via 413 having a bottom dimension 420 of 0.35 µm and a height 422 of 1.2 µm. A tantalum barrier layer 412 was applied over the surface 414 of the via 413 using an ion-deposition plasma process. In particular, the DC power to the target was 2 kW, the RF power to the coil (at 2 MHz) was 1.5 kW. In this instance there was no bias to the substrate. The pressure in the vacuum chamber was about 40 mT, and the temperature of the substrate at the time of deposition of the tantalum barrier layer 412 was about 75° C. Tantalum was deposited for a period of about 60 seconds. The absence of substrate bias resulted in the deposit of a large quantity of tantalum at the bottom 416 of via 413. The tantalum layer 412 was about 1,200 Å thick 424 on the substrate surface, about 400 Å thick on the walls of the via 413 near the opening 426, and thinned toward the bottom 416. The thickness of the tantalum layer 412 was minimal (if present at all) at the corner 415 near the bottom 416 of the via 413. The average thickness of the tantalum layer 412 at the bottom 416 of via 413 was about 300 Å. The thin barrier layer 412 at corners 415 provided a source for diffusion of subsequently applied copper fill (not shown) into both the silicon dioxide dielectric layer 411 and into the silicon substrate 410.

The thinning of a titanium nitride barrier layer in contact with an aluminum fill is not as critically important as the thinning of a tantalum barrier layer in contact with a copper fill, since the aluminum forms an interface with a silicon dioxide insulating layer of the kind typically used in the semiconductor industry as a dielectric. However, a titanium wetting layer is typically used, for example, as a wetting layer underlying an aluminum fill in a contact via. If the titanium is contaminated during deposition by materials sputtered from surrounding surfaces, its ability to perform as a wetting layer during the aluminum fill is diminished.

When the conductive material is copper, not only is there a possible contamination problem due to sputtering of underlying surface onto which a tantalum or tantalum nitride barrier layer is applied, but in addition, if the barrier layer becomes too thin, the copper can diffuse into the silicon dioxide dielectric layer, eventually leading to device failure. When copper is used as the conductive fill material, it is important to find a means of ensuring a more constant thickness of the carrier/barrier layer over the entire aperture surface. This avoids the formation of an overhang at the top of a contact via which can lead to closure of the via opening and void formation upon copper fill. In addition a continuous conformal barrier layer prevents the diffusion of copper into adjacent layers segregated from the copper by the barrier layer. Once again, an important consideration in determining how to form a continuous conformal barrier layer or wetting layer is the amount of contamination of adjacent surfaces which will occur as a result of the deposition process.

Example Three

Figure 5:
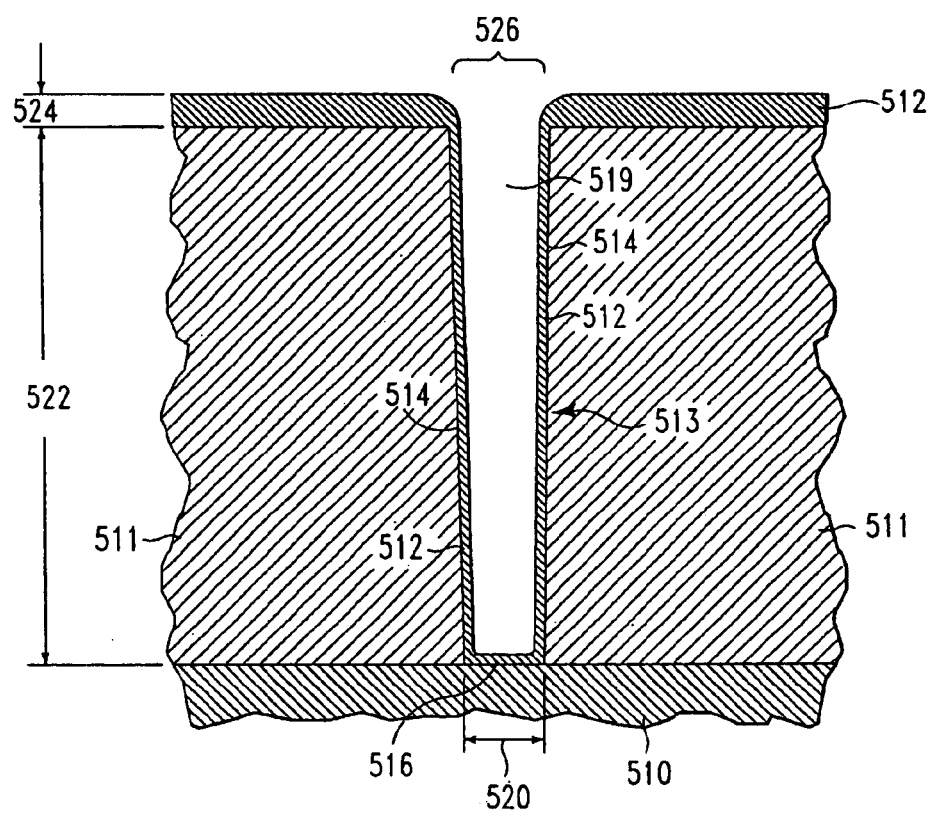
FIG. 5 shows a schematic of the kind shown in FIGS. 3 and 4, where the technique of the present invention is used to ensure that the base of the contact is not eroded away and is not contaminated, while a sculptured, even layer of deposited target material is obtained on the walls of the via.

FIG. 5 shows a schematic of a SEM profile of silicon wafer substrate 510 with a silicon dioxide dielectric layer 511 deposited thereover. The silicon dioxide layer 511 had been patterned to contain a via 513 having a bottom dimension 520 of 0.35 µm and a height 22 of 1.2 µm. A tantalum barrier layer 512 was applied over the surface 514 of the via 513 using an ion-deposition plasma process. In particular, an initial deposition of tantalum was made using a DC power to the target was 2 kW, the RF power to the coil (at 2 MHz) was 1.5 kW, the pressure in the vacuum chamber was about 40 mT, and the substrate temperature was about 25° C. Tantalum barrier layer 512 material was applied for about 15 seconds without the application of substrate biasing power.

The substrate bias was then applied to −60V (250 W), and additional tantalum was applied using ion deposition plasma for a period of about 45 seconds. The pressure in the vacuum chamber was about 40 mT and the substrate temperature was about 25° C. During this second deposition period, tantalum from the first deposition period was resputtered, with excess tantalum being removed from the area of upper opening 526 of via 513 and reshaped in the area near the bottom 516 of via 513. The final via structure was as shown in FIG. 5, where the tantalum barrier layer has a relatively uniform thickness 524 of about 1,000 Å on the upper substrate surface of via 513, no overhang at opening 526, and a uniform thickness of about 150 Å on the inside walls of the via 513. There was no damage to underlying silicon substrate 510 or to the silicon dioxide layer 511 during deposition of barrier layer 51.

This ion deposition plasma sputtering technique can be designed to have multiple non-biased and biased deposition steps under varying conditions optimized for the feature geometries of interest. The substrate bias can be ramped up and down in a manner which permits the desired sculpturing. The technique is applicable to any ion deposition plasma sputtered layer, including barrier layers such as: Ta, TaN, TaSiN, Mo, MoN, MoSiN, TiN, TiSiN, W, WN, and WSiN, for example; and, wetting layers such as Ta, Mo, and Ti, for example. The technique also works for the application of a seed layer of metallic conductive materials such as Cu, Ni, Ag, Au, Al, W, and Pt, for example. In particular, applicants deposited a copper seed layer using this technique and found that the copper deposition followed the same thickness profile patterns as those exhibited during the tantalum barrier layer deposition.

The method of the present invention is particularly beneficial when used for sculpting copper deposition into a contact via, since a build up on the upper edges (shoulders) of the via opening can lead to closure of the opening prior to complete filling, as previously mentioned. Further, too much sputtering at the bottom of the via can resputter all of the copper seed layer from the bottom surface, leaving a bare tantalum barrier layer. Upon subsequent application of copper fill, the fill will not grow where there is no seed layer, and a void is created at the bottom of the contact. For example, when the copper fill is electroplated, the electroplated copper will not grow where there is no seed layer due to lack of current for electroplating in such areas. The present sculpturing method solves these problems while avoiding the contamination of adjacent surfaces during a copper seed layer deposition.

The above described preferred embodiments are not intended to limit the scope of the present invention, as one skilled in the art can, in view of the present disclosure expand such embodiments to correspond with the subject matter of the invention claimed below.

We claim:

1. A method of preventing diffusion from a copper conductive layer through an underlying tantalum-comprising barrier layer, comprising:

(a) depositing said tantalum-comprising barrier layer in a manner such that said tantalum-comprising barrier layer is variable in thickness and continuous, wherein at least a portion of said tantalum-comprising barrier layer has a thickness in the range of about 5 Å, but not less than 5 Å; and (b) depositing said copper layer over said tantalum-comprising layer.

2. A method in accordance with claim 1, wherein said tantalum-comprising layer is tantalum.

3. A method in accordance with claim 1, wherein said tantalum-comprising barrier layer is applied using physical vapor deposition.

4. A method in accordance with claim 3, wherein said physical vapor deposition comprises a sputtering technique.

* * * * *